(12) United States Patent
Yamashita (10) Patent No.: US 10,347,316 B2
(45) Date of Patent: Jul. 9, 2019

(54) INPUT BUFFER CIRCUIT

(71) Applicant: Micron Technology, Inc., Boise, ID (US)

(72) Inventor: Akira Yamashita, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/669,392

(22) Filed: Aug. 4, 2017

(65) Prior Publication Data

US 2019/0043550 A1    Feb. 7, 2019

(51) Int. Cl.
| | | |
|---|---|---|
| *G11C 7/10* | (2006.01) | |
| *G11C 11/4074* | (2006.01) | |
| *G11C 11/4072* | (2006.01) | |
| *G11C 11/4076* | (2006.01) | |
| *G11C 11/408* | (2006.01) | |
| *G11C 11/4093* | (2006.01) | |
| *G11C 11/4094* | (2006.01) | |

(52) U.S. Cl.
CPC .......... *G11C 11/4074* (2013.01); *G11C 7/109* (2013.01); *G11C 7/1051* (2013.01); *G11C 7/1078* (2013.01); *G11C 11/4072* (2013.01); *G11C 11/4076* (2013.01); *G11C 11/4085* (2013.01); *G11C 11/4093* (2013.01); *G11C 11/4094* (2013.01)

(58) Field of Classification Search
CPC ...... G11C 7/1078; G11C 7/1051; G11C 7/109
USPC ...................... 365/189.15, 189.05
See application file for complete search history.

(56) References Cited

U.S. PATENT DOCUMENTS

| | | | | |
|---|---|---|---|---|
| 6,317,369 B1* | 11/2001 | Kubo | ................. | G11C 7/1066 365/189.05 |
| 6,807,108 B2* | 10/2004 | Maruyama | ........... | G11C 7/1078 365/189.05 |
| 7,652,937 B2* | 1/2010 | Searles | ............... | G06F 13/4243 365/189.14 |
| 7,948,272 B2* | 5/2011 | Lee | ...................... | H03K 19/003 327/108 |
| 7,983,362 B2* | 7/2011 | Searles | ............... | G11C 7/1066 327/127 |
| 8,879,335 B2* | 11/2014 | Koyanagi | ...... | H03K 19/017527 365/189.05 |

(Continued)

OTHER PUBLICATIONS

International Search Report and Written Opinion received for PCT Application No. PCT/US2018/043535 dated Nov. 21, 2018, pp. all.

*Primary Examiner* — Son L Mai
(74) *Attorney, Agent, or Firm* — Dorsey & Whitney LLP (57) ABSTRACT

Apparatuses for receiving an input data signal are described. An example apparatus includes: a plurality of data input circuits and an internal data strobe generator. Each data input circuit of the plurality of data input circuits includes: an amplifier that receives data from a data terminal, and latches the data in an enable state and refrains from latching data in a disable state; and a voltage control circuit coupled to a tail node of the amplifier and provides a first voltage to the tail node during the enable state, and further provides a second voltage different from the first voltage to the tail node in a first mode and to sets the tail node in a floating state in a second mode during the disable state. The internal data strobe signal generator provides a plurality of internal data strobe signals to the plurality of corresponding data input circuits respectively.

20 Claims, 7 Drawing Sheets

(56) References Cited

U.S. PATENT DOCUMENTS

| | | | |
|---|---|---|---|
| 2005/0036395 A1* | 2/2005 | Maejima | G11C 16/0483 |
| | | | 365/232 |
| 2005/0117432 A1* | 6/2005 | Graaff | G11C 5/14 |
| | | | 365/226 |
| 2007/0041257 A1 | 2/2007 | Kim | |
| 2007/0081405 A1 | 4/2007 | Yoo et al. | |
| 2008/0151674 A1 | 6/2008 | Ohata et al. | |
| 2010/0103758 A1 | 4/2010 | Riho | |
| 2015/0262650 A1 | 9/2015 | Okahiro et al. | |

* cited by examiner

INPUT BUFFER CIRCUIT

BACKGROUND

High data reliability, high speed of memory access, and reduced chip size are features that are demanded from semiconductor memory.

In recent years, there has been an effort to increase access speed while reducing power consumption for semiconductor devices. As part of that effort to increase access speed, it may be desirable to include input receiver circuits having faster operation in input buffers for receiving address signals, command signals and clock signals. Simultaneously, it may be desirable to accommodate a wide range of input signals at the input receiver circuits to meet recent semiconductor devices (e.g., low-power double data rate synchronous DRAM). For example, Low Power Double Data Rate 4 (LPDDR4) specification (JESD209-4) specifies that an data input reference voltage ($V_{REF}$) operating point range from 10% to 42% of a power supply voltage for data input ($V_{DD}$). Along these lines, an input receiver circuit including differential amplifiers have been developed. For example, a data latch type input buffer has been used as an input buffer for memory devices (e.g., LPDDR4). A data latch type input (DQ) buffer in a memory device amplifies a data signal and latches the data signal by amplifying a voltage difference between the data input signal and the $V_{REF}$ when a clock signal CLK is at a logic high level, and initializes each node in the DQ buffer by precharging each node when the clock signal CLK is at a logic low level. The DQ input buffer performs a sequence of amplification and latch operation responsive to a signal input and a precharge operation in turn during each clock cycle. Source nodes of input transistors may receive a power supply voltage $V_{DD}$ and gate nodes of the input transistors coupled to input nodes (IN+ node and IN− node) may receive a data input signal DQ and the reference voltage $V_{REF}$, respectively while performing the sequence of amplification and latch operation.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
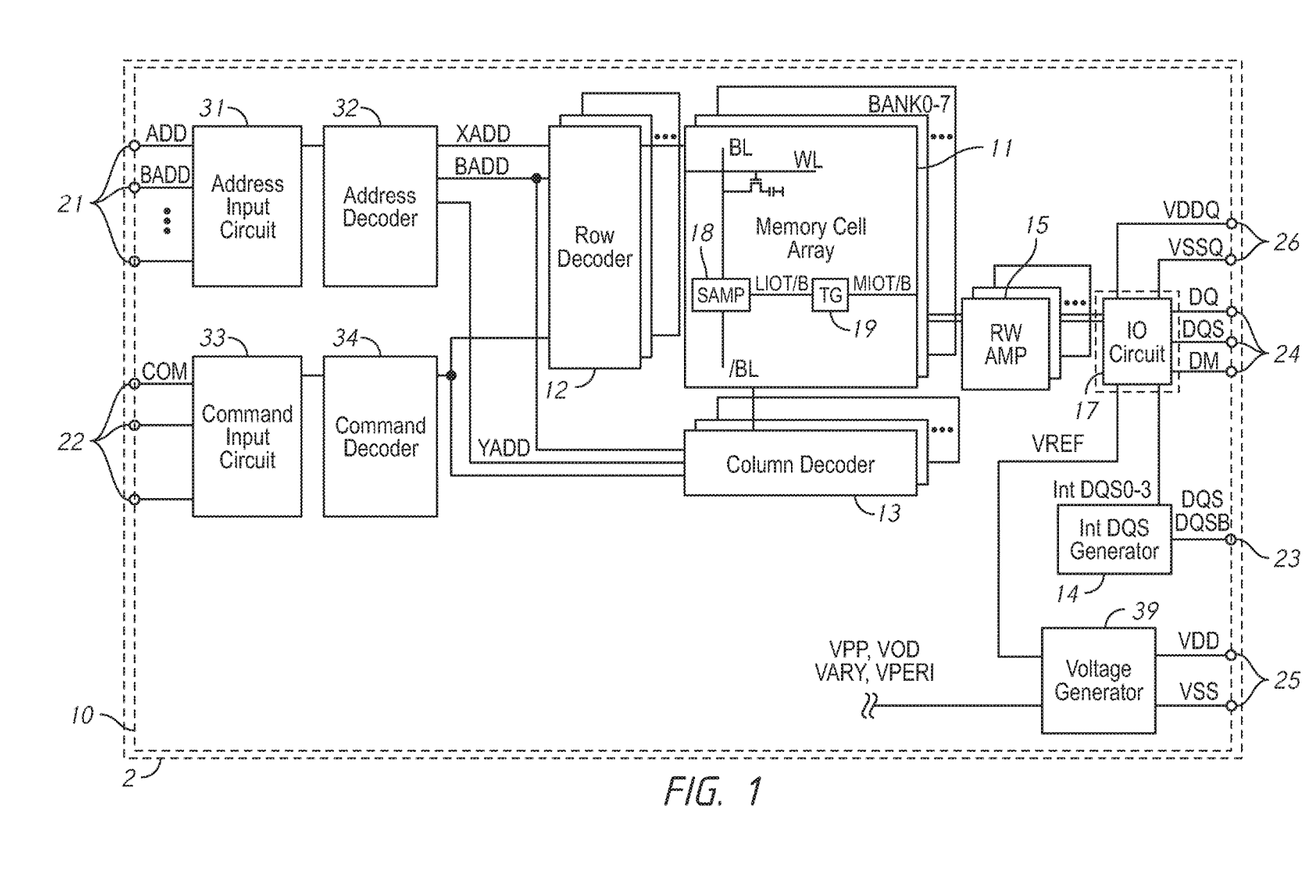
FIG. 1 is a block diagram of a semiconductor device in accordance with the present disclosure.

FIG. 1 is a block diagram of a semiconductor device in accordance with an embodiment of the present disclosure. The semiconductor device 10 may be an LPDDR4 SDRAM integrated into a single semiconductor chip, for example. The semiconductor device 10 may be mounted on an external substrate 2 that is a memory module substrate, a mother board or the like. As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, data strobe (DQS) terminals 23, data terminals 24 and power supply terminals 25 and 26. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input/output circuit 17 may include input buffers, according to one embodiment. The input/output circuit 17 receives external clock signals as a timing signal for determining input timing of write data DQ and output timing of read data DQ.

The power supply terminals 25 are supplied with power supply potentials VDD and VSS. These power supply potentials VDD and VSS are supplied to a voltage generator 39. The voltage generator 39 may generate various internal potentials VPP, VOD, VARY, VPERI, and the like based on the power supply potentials VDD and VSS. The internal potential VPP may be mainly used in the row decoder 12, the internal potentials VOD and VARY may be mainly used in the sense amplifiers 18 included in the memory cell array 11, and the internal potential VPERI may be used in many other circuit blocks.

Power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

The input/output circuit 17 may also be coupled to an internal data strobe (DQS) generator circuit 14. The data strobe terminals 23 are supplied with external data strobe signals DQS and DQSB, respectively. These external data strobe signals DQS and DQSB are complementary to each other and are supplied to the internal data strobe (DQS) generator circuit 14. The internal data strobe (DQS) generator circuit 14 may generate a plurality of internal data strobe signals (e.g., Int DQS 0-3).

Figure 2:
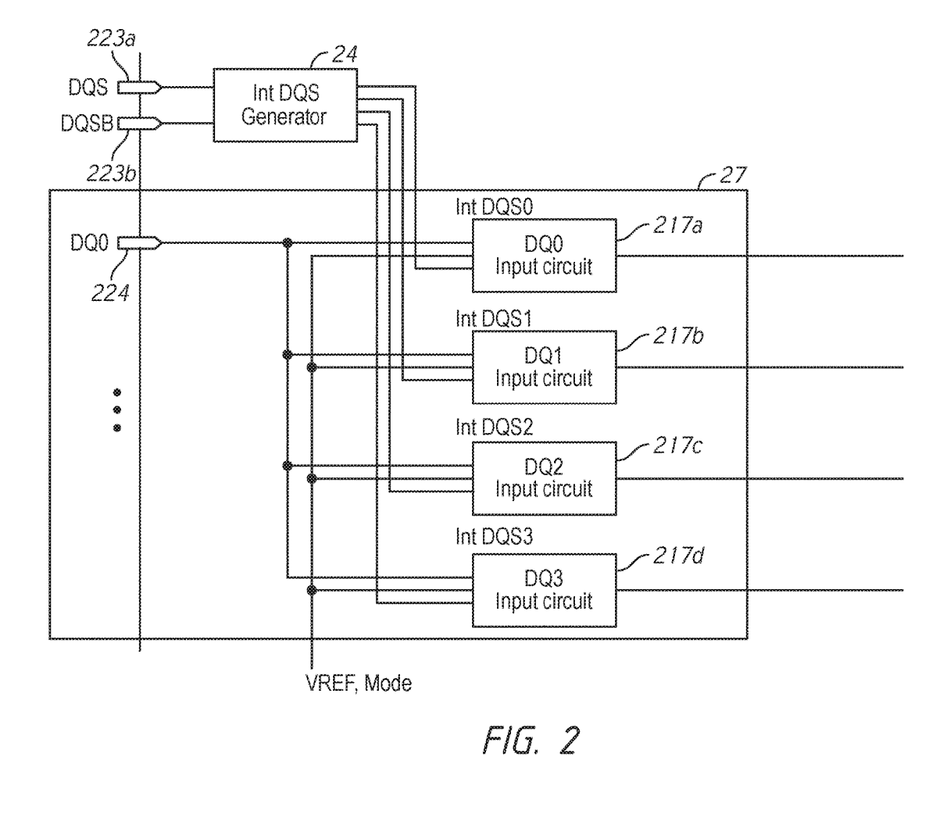
FIG. 2 is a schematic diagram of an input/output circuit and an internal data strobe generator in accordance with an embodiment of the present disclosure.
Figure 3:
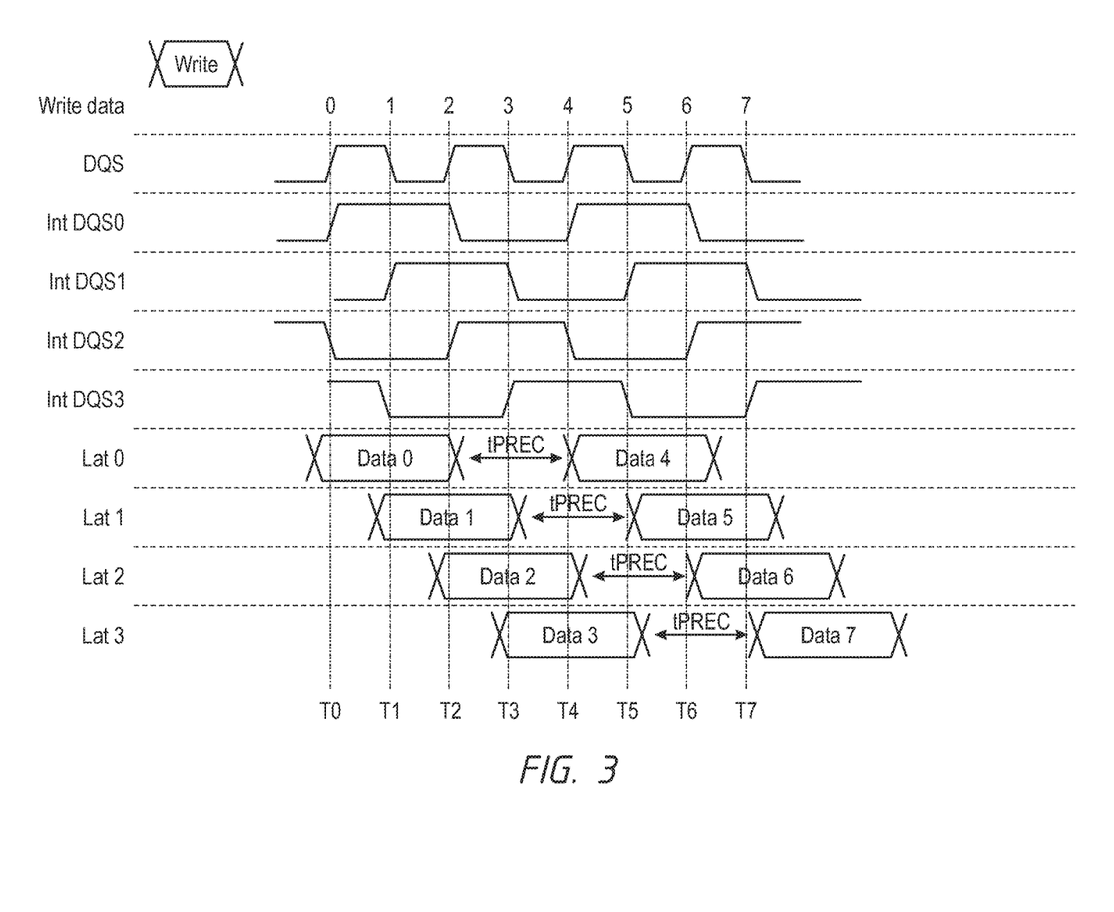
FIG. 3 is a timing diagram of receiving data at the input/output circuit according to an embodiment of the present disclosure.

FIG. 2 is a schematic diagram of an input/output circuit 27 and an internal data strobe generator 24 according to an embodiment of the present disclosure. FIG. 3 is a timing diagram of receiving data at the input/output circuit 27 according to an embodiment of the present disclosure. For example, the input/output circuit 27 may be the input/output circuit 17 of FIG. 1. The input/output circuit 27 includes data terminals 224 including a data terminal DQ0. The input/output circuit 27 also includes a plurality of data input circuits 217a-d.

The internal data strobe (DQS) generator 24 may include a data strobe terminal DQS 223a and a complementary data strobe terminal DQSB 223b that receive a complementary pair of data strobe signals (DQS and DQSB) that are used for capturing data at high data rates. For example, the internal DQS generator 24 may be a frequency divider that may provide 4-phase signals, such as internal data strobe signals Int DQS0 to Int DQS3 that may have a frequency that is ½ of a frequency $F_{DQS}$ of the data strobe signal DQS. For example, an Int DQS0 signal may be activated (having a rising edge) while write data 0 and 4 are being received at T0 and T4 respectively at the data terminal DQ0. An Int DQS1 signal may be activated while write data 1 and 5 are being received at T1 and T5 (lagging a half cycle from DQS, or lagging a ¼ phase from Int DQS0) respectively at the data terminal DQ0. An Int DQS2 signal may be activated while write data 2 and 6 are being received at T2 and T6 (lagging one cycle from DQS, or lagging a ½ phase from Int DQS0) respectively at the data terminal DQ0. An Int DQS3 signal may be activated while write data 3 and 7 are being received at T3 and T7 (lagging one and half cycles from DQS, or lagging a ¾ phase from Int DQS0) respectively at the data terminal DQ0.

The plurality of data input circuits 217a-d may receive a reference voltage (VREF) from a voltage generator (e.g., the voltage generator 39 in FIG. 1) and data DQ0 from the data terminal DQ0. The plurality of data input circuits 217a-d may further receive a corresponding internal data strobe signal, Int DQS0 to Int DQS3, respectively to latch the write data 0-7 on the data signal DQ0 for capturing the data. Thus, the data input circuit 217a may latch the write data 0 and 4 with the Int DQS0 signal, the data input circuit 217b may latch the write data 1 and 5 with the Int DQS1 signal, the data input circuit 217c may latch the write data 2 and 6 with the Int DQS2 signal, and the data input circuit 217d may latch the write data 3 and 7 with the Int DQS3 signal. The above is merely an example, and the input/output circuit 27 may receive a plurality of write data (e.g., the write data 0-7) while an amplifier in each data input circuit 217 may have a capacity of amplifying fewer write data (e.g., the write data 0 and 4, 1 and 5, 2 and 6, or 3 and 7). For example, an inactive time tPREC for precharging each amplifier in each data input circuit 217 may be a wait time between receiving first data and second data (e.g., the write data 0 and 4, 1 and 5, 2 and 6, or 3 and 7). During the inactive time tPREC, each amplifier in each data input circuit 217 may perform a precharge operation on a specific node (e.g., ZPtail node in FIGS. 4-6 or ZNtail node in FIG. 7 that will be described later in this disclosure) in one mode and may refrain from the precharge operation in a mode other than the one mode. For example, a mode signal "Mode" may be provided from a mode register circuit (not shown) or by an electrical fuse (not shown) in order to indicate the mode. In a test operation, the one mode for executing the precharge operation and the other mode for refraining from the precharge operation both may be tested.

Figure 4:
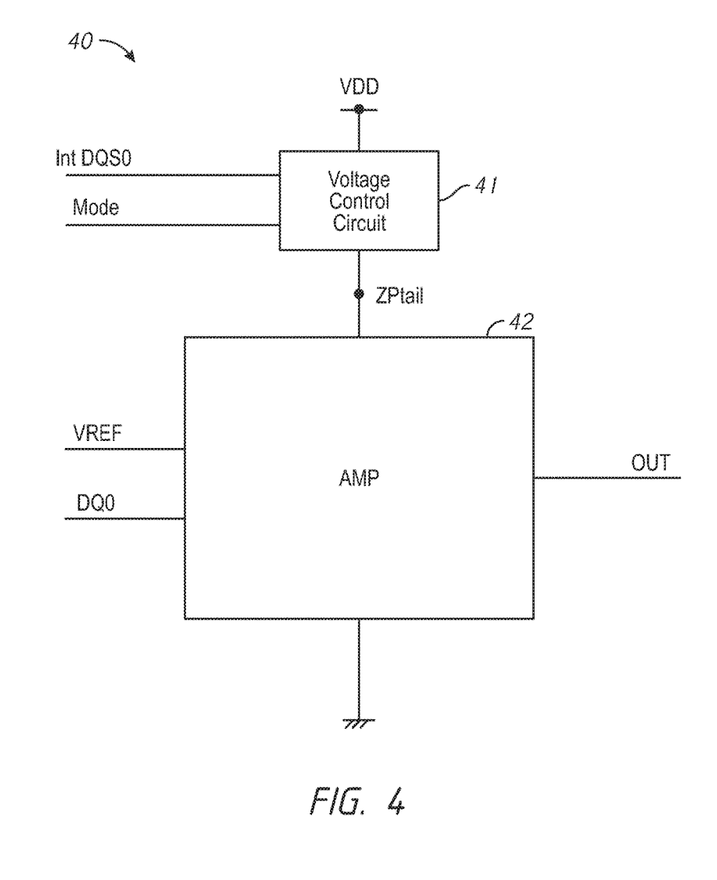
FIG. 4 is a block diagram of a data input circuit in accordance with an embodiment of the present disclosure.

FIG. 4 is a block diagram of a data input circuit 40 in accordance with an embodiment of the present disclosure. For example, the data input circuit 40 may be the data input circuit 217a in FIG. 2. The data input circuit 40 may include a voltage control circuit 41 and a data circuit 42 (e.g., an amplifier AMP). The voltage control circuit 41 may receive an internal data strobe signal (e.g., the Int DQS0), the mode signal (e.g., "Mode") and a positive potential (e.g., VDD) and may further provide an intermediate signal to a ZPtail node. The data circuit 42 may be coupled between the ZPtail node and a power node coupled to a ground potential. The data circuit 42 may receive a reference voltage VREF and the data signal DQ0 and may further provide an output signal OUT. Functionalities of the voltage control circuit 41 and the data circuit 42 will be described later in detail with reference to FIGS. 5 and 6.

Figure 5:
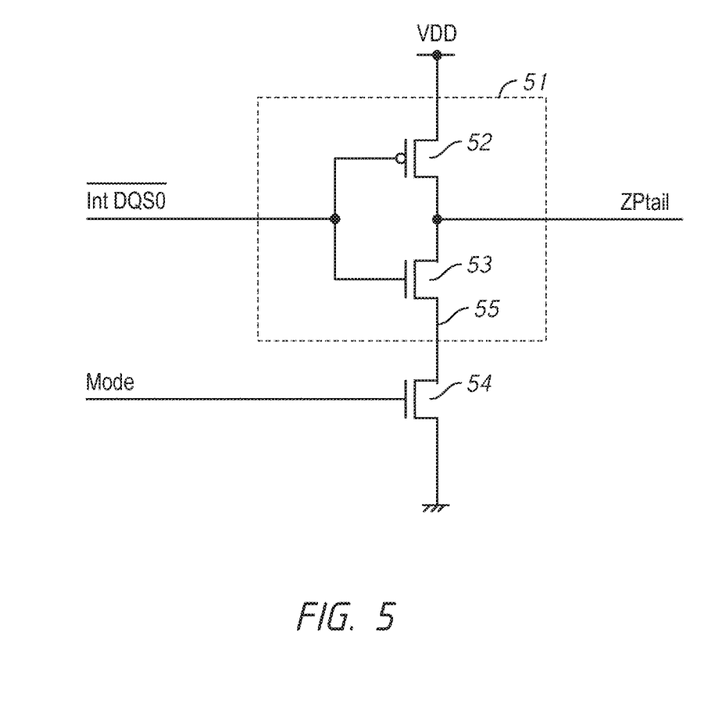
FIG. 5 is a circuit diagram of a voltage control circuit according to an embodiment of the present disclosure.

FIG. 5 is a circuit diagram of a voltage control circuit 50 according to an embodiment of the present disclosure. For example, the voltage control circuit 50 may be the voltage control circuit 41 in FIG. 4. The voltage control circuit 50 may include an inverter 51 that may receive a complementary signal of the internal data strobe signal Int DQS0 and may further provide the intermediate signal to the ZPtail node. For example, the inverter 51 may include a first type of transistor (e.g., p-channel field effect transistor) 52 and a second type of transistor (e.g., n-channel field effect transistor) 53. A source node of the first type of transistor 52 may be coupled to the positive power potential VDD and a drain node of the first type of transistor 52 may be coupled to the ZPtail node. A drain node of the second type of transistor 53 may be coupled to the ZPtail node. Gate nodes of the first type of transistor 52 and the second type of transistor 53 may be receive the complementary signal of the internal data strobe signal Int DQS0.

The voltage control circuit 50 may further include another transistor 54 that may another second type of transistor (e.g., n-channel field effect transistor). For example, a source node of the transistor 54 may be coupled to a ground potential (e.g., VSS) and a drain node 55 of the transistor 54 may be coupled to the source node of the second type of transistor 53. A gate node of the transistor 54 may receive the mode signal (e.g., "Mode"). Thus, the transistor 54 may be activated and the drain node 55 may be set to the ground potential responsive to the mode signal in an active state (e.g., logic level "1") and the transistor 54 may be deactivated and the drain node 55 may be left to a floating state (hi-Z) responsive to the mode signal in an inactive state (e.g., logic level "0").

Thus, the intermediate signal on the ZPtail node may be set to the positive power potential VDD responsive to the inverted signal of int_DQS0 being in an inactive state (the internal data strobe signal int_DQS0 being in an active state) for latching the data DQ0. On the other hand, the intermediate signal on the ZPtail node may be set to the ground potential responsive to an active state (e.g., a logic high level, "1") of the mode signal Mode whereas the intermediate signal on the ZPtail node may be left to a floating state (hi-Z) responsive to an inactive state (e.g., a logic low level, "0") of the mode signal Mode while the inverted signal of int_DQS0 is being in an active state (the internal data strobe signal int_DQS0 being in an inactive state).

Figure 6:
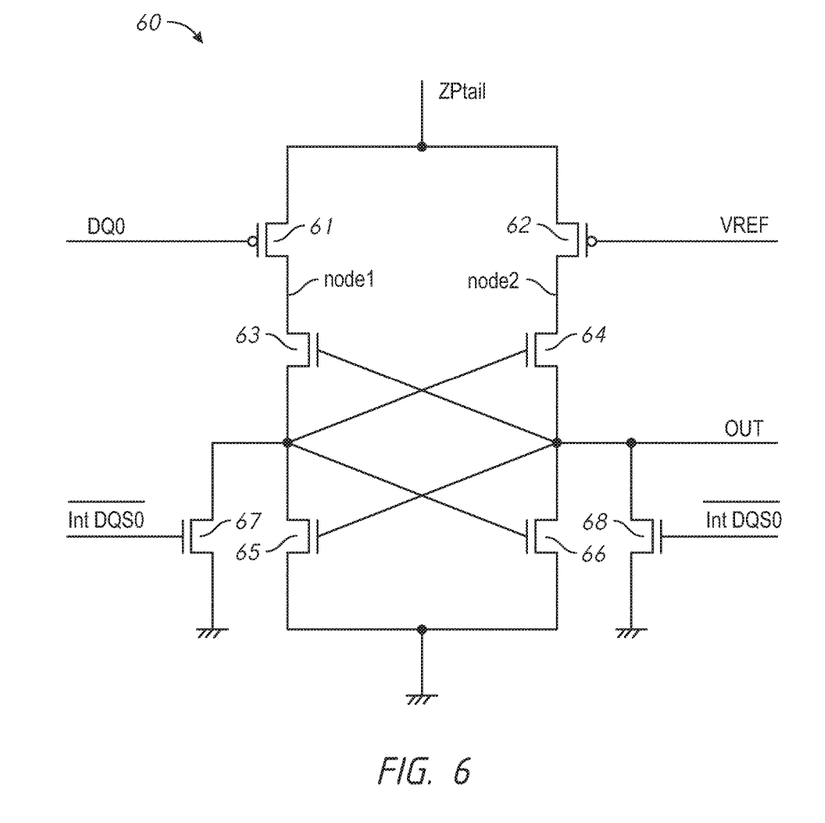
FIG. 6 is a circuit diagram of an amplifier according to an embodiment of the present disclosure.

FIG. 6 is a circuit diagram of an amplifier 60 according to an embodiment of the present disclosure. For example, the amplifier 60 may be the data circuit 42 in FIG. 4. The amplifier 60 may include transistors 61, 62, 63, 64, 65 and 66. A data input signal DQ0 is provided to a gate of the transistor 61. A reference voltage VREF is provided to a gate of the transistor 62. A sequence of amplification and latch operation are executed responsive to the inverted signal of the internal data strobe signal Int DQS0 at an active state (e.g., a logic high level, "1") that may deactivate the transistors 65 and 66. The power supply voltage VDD may be provided to nodes, (node1 and node2) through transistors 61 and 62, and voltages of the nodes (node1 and node2) are increased from a precharge level (e.g., the ground potential VSS) depending on the data input signal DQ0. Thus, a voltage difference Vdiff between the nodes (node1 and node2) may be caused based on a difference between a voltage of the input data input signal DQ0 and the reference voltage VREF. Because the power supply voltage VDD is provided to nodes, (node1 and node 2), voltages at an OUT node may be increased from the ground potential VSS that may be a precharge level through the transistor 64, when the voltage difference Vdiff exceeds a threshold voltage VTh of the transistor 64. Due to voltages of the node 1 and the node2 that are increased up to approximately the positive power potential VDD, the amplifier 60 may latch a voltage difference between a node coupled to gate nodes of the transistors 64 and 66 and the OUT node of the amplifier 60, and a logic high level signal (VDD) or a logic low level signal (VSS) may be provided to the OUT node. In a precharge operation, when the inverted signal of the internal data strobe signal Int DQS0 is at an active state (e.g., a logic high level), the OUT node may be precharged by precharge transistor 68 to the ground potential VSS (e.g., the logic low level, "0"). Previously described with reference to FIG. 5, the inverted signal of the internal data strobe signal Int DQS0 at the active state may further set the ZPtail node either to the ground potential VSS or at a floating state depending on the mode signal Mode being active or inactive. Simultaneously, the output signal OUT at the ground potential may set transistors 63, 64, 65 and 66 in an inactive state. Thus, the voltage of a common node (the ZPtail node) between the transistors 61 and 62 may be controlled during the precharge operation.

Figure 7:
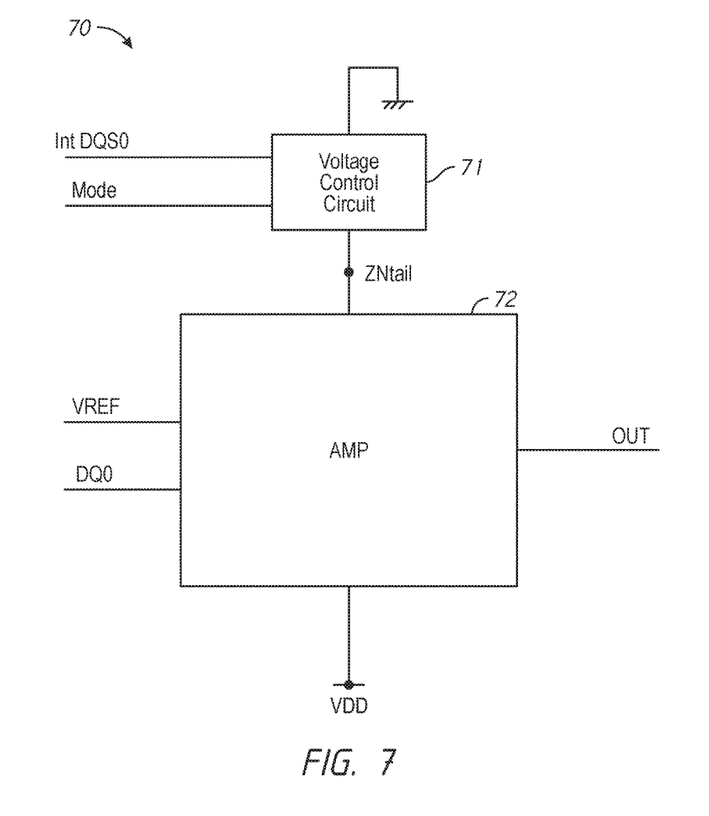
FIG. 7 is a block diagram of a data input circuit in accordance with an embodiment of the present disclosure.

FIG. 7 is a block diagram of a data input circuit 70 in accordance with an embodiment of the present disclosure. For example, the data input circuit 70 may be the data input circuit 217a in FIG. 2. The data input circuit 70 may include a voltage control circuit 71 and an amplifier 72. The voltage control circuit 41 may receive an internal data strobe signal (e.g., the Int DQS0), the mode signal (e.g., "Mode") and a ground potential and may further provide an intermediate signal to a ZNtail node. The amplifier 72 may be coupled between the ZNtail node and a power node coupled to a positive power potential VDD. The amplifier 72 may receive a reference voltage VREF and the data signal DQ0 and may further provide an output signal OUT. Similarly, a voltage of a common node between transistors receiving the data signal DQ0 and the reference voltage VREF respectively may be controlled during the precharge operation.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a data circuit configured to be activated in an enable state and to be deactivated in a disable state; and
    a voltage control circuit configured to supply in the enable state the data circuit with a first voltage, the voltage control circuit further configured to supply in the disable state the data circuit with a second voltage different from the first voltage when a first mode is set and cause the data circuit to be in a floating state when a second mode is set.

2. The apparatus of claim 1, further comprising an external terminal coupled to the data circuit, wherein the data circuit is configured to amplify at least one of a plurality of data received in series at the external terminal.

3. The apparatus of claim 2, wherein the plurality of data includes first data, second data following the first data, third data following the second data and fourth data following the third data, the data circuit is configured to amplify the first data in the enable state and further configured to refrain from amplifying the second, third and fourth data in the disable state.

4. The apparatus of claim 1, wherein the second voltage is a ground voltage.

5. The apparatus of claim 1, further comprising an external terminal, wherein the data circuit includes:
a first node coupled to the voltage control circuit;
a second node coupled to be supplied with a ground voltage;
a first transistor coupled between the first node and the second node, wherein a gate of the first transistor being coupled to the external terminal; and
a second transistor coupled in parallel to the first transistor between the first node and the second node, wherein a gate of the second transistor being supplied with a reference voltage.

6. The apparatus of claim 1, wherein the data circuit includes:
a first node coupled to the voltage control circuit; and
a second node coupled to be supplied with a power supply voltage.

7. The apparatus of claim 1, wherein the first mode is indicative of performing a precharge operation and the second mode is indicative of refraining from a precharge operation.

8. An apparatus comprising:
a plurality of data input circuits, each data input circuit of the plurality of data input circuits includes:
an amplifier configured to receive data from a data terminal, further configured to latch the data in an enable state and to refrain from latching data in a disable state; and
a voltage control circuit coupled to a first node of the amplifier, configured to provide a first voltage to the first node during the enable state; and
an internal data strobe signal generator configured to provide a plurality of internal data strobe signals to the plurality of corresponding data input circuits respectively,
wherein during the disable state, the voltage control circuit is configured to provide a second voltage to the first node in a first mode, and further configured to set the first node in a floating state in a second mode, and
wherein the second voltage is different from the first voltage.

9. The apparatus of claim 8, wherein the first mode is indicative of performing a precharge operation and the second mode is indicative of refraining from a precharge operation.

10. The apparatus of claim 8, wherein the plurality of internal data strobe signals includes a first internal data strobe signal and a second internal data strobe signal,
wherein a phase of the first internal data strobe signal is different from a phase of the second internal data strobe signal.

11. The apparatus of claim 10, wherein the internal data strobe signal generator includes a frequency divider.

12. The apparatus of claim 10, wherein the plurality of data input circuits includes a first data input circuit,
wherein the first data input circuit is configured to receive the first internal data strobe signal and further configured to switch to an enable state responsive to an active state of the first internal data strobe signal and to switch to a disable state responsive to an inactive state of the first internal data strobe signal.

13. The apparatus of claim 10, wherein the data terminal is configured to receive first data, followed by second data, third data, and fourth data at a first time, a second time, a third time and a fourth time respectively,
wherein the internal data strobe signal generator is configured to provide the first internal data strobe signal in an active state at the first time and the third time, and
wherein the internal data strobe signal generator is configured to provide the second internal data strobe signal in an active state at the second time and the fourth time.

14. The apparatus of claim 13, wherein an amplifier of the first data input circuit is configured to latch and amplify the data at the first time and the third time, and further configured to refrain from latching the data at the second time and the fourth time, responsive to the first internal data strobe signal.

15. The apparatus of claim 14, wherein an interval between the first time and the third time is an inactive time for precharging an amplifier of the first data input circuit.

16. The apparatus of claim 8, wherein the second voltage is a ground voltage.

17. The apparatus of claim 8, wherein the amplifier includes:
a power node coupled to a ground potential;
a first transistor coupled between the first node and the power node, wherein a gate of the first transistor is coupled to the data terminal; and
a second transistor coupled between the first node and the power node, wherein a gate of the second transistor is configured to receive a reference voltage.

18. The apparatus of claim 8, wherein the amplifier includes a power node coupled to a power supply potential.

19. An apparatus comprising:
a data input circuit comprising:
an amplifier coupled to a first node and configured to be in either an active state or an inactive state responsive to an enable signal; and
a voltage control circuit configured to provide a first voltage to the first node while the data input circuit is in the active state,
wherein while the data input circuit is in the inactive state, the voltage control circuit is configured to provide a second voltage to the first node in a first mode and further configured to set the first node to a floating state in a second mode, and
wherein the second voltage is different from the first voltage.

20. The apparatus of claim 19, further comprising a mode register configured to provide a mode signal indicative of the first mode or the second mode,
wherein the first mode is indicative of performing a precharge operation and the second mode is indicative of refraining from a precharge operation.

* * * * *